United States Patent
Hekmatshoartabari et al.

(10) Patent No.: US 8,940,580 B2
(45) Date of Patent: Jan. 27, 2015

(54) TEXTURED MULTI-JUNCTION SOLAR CELL AND FABRICATION METHOD

(75) Inventors: Bahman Hekmatshoartabari, White Plains, NY (US); Ali Khakifirooz, Mountain View, CA (US); Ghavam G. Shahidi, Round Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/544,380

(22) Filed: Jul. 9, 2012

(65) Prior Publication Data

US 2014/0004654 A1    Jan. 2, 2014

Related U.S. Application Data

(63) Continuation of application No. 13/535,974, filed on Jun. 28, 2012.

(51) Int. Cl.
*H01L 21/00* (2006.01)

(52) U.S. Cl.
USPC .......................................... 438/107

(58) Field of Classification Search
None
See application file for complete search history.

(56) References Cited

U.S. PATENT DOCUMENTS

| | | | |
|---|---|---|---|
| 3,977,071 A | 8/1976 | Jarman | |
| 4,295,002 A | 10/1981 | Chappell et al. | |
| 5,246,886 A | 9/1993 | Sakai et al. | |
| 5,268,315 A * | 12/1993 | Prasad et al. | 438/314 |
| 5,510,645 A * | 4/1996 | Fitch et al. | 257/522 |
| 5,990,415 A * | 11/1999 | Green et al. | 136/255 |
| 6,127,623 A * | 10/2000 | Nakamura et al. | 136/256 |
| 6,825,408 B2 | 11/2004 | Nagano et al. | |
| 6,864,520 B2 | 3/2005 | Fischetti et al. | |
| 7,704,896 B2 | 4/2010 | Haukka et al. | |
| 7,737,357 B2 | 6/2010 | Cousins | |
| 7,741,144 B2 | 6/2010 | Choi et al. | |
| 7,928,317 B2 | 4/2011 | Atanackovic | |
| 7,952,018 B2 | 5/2011 | Shima et al. | |
| 2002/0050289 A1 | 5/2002 | Wada et al. | |
| 2003/0160172 A1* | 8/2003 | Ashokan et al. | 250/338.4 |
| 2005/0186712 A1* | 8/2005 | Smith | 438/125 |
| 2005/0242364 A1 | 11/2005 | Moustakas et al. | |
| 2009/0114274 A1 | 5/2009 | Fritzemeier | |
| 2010/0148318 A1 | 6/2010 | Wang et al. | |

(Continued)

OTHER PUBLICATIONS

Al-Bustani, A., et al. "Triple Heterojunction ALGAAS-GAAS Solar Cells With Front V-Groove Surface" Renewable Energy, vol. 8, No. 1. May 1996. pp. 348-353.

(Continued)

*Primary Examiner* — Charles Garber
*Assistant Examiner* — Andre' C Stevenson
(74) *Attorney, Agent, or Firm* — Tutunjian & Bitetto, P.C.; Louis J. Percello

(57) ABSTRACT

A method for forming a multi junction photovoltaic device includes providing a germanium layer and etching pyramidal shapes in the germanium layer such that (111) facets are exposed to form a textured surface. A first p-n junction is formed on or over the textured surface from III-V semiconductor materials. Another p-n junction is formed over the first p-n junction from III-V semiconductor materials and follows the textured surface.

24 Claims, 6 Drawing Sheets

(56) References Cited

U.S. PATENT DOCUMENTS

| | | |
|---|---|---|
| 2010/0212729 A1 | 8/2010 | Hsu |
| 2010/0236617 A1* | 9/2010 | Yi .................................. 136/256 |
| 2010/0236647 A1* | 9/2010 | Simnioniw et al. ...... 137/565.01 |
| 2011/0048516 A1* | 3/2011 | Bedell et al. .................. 136/255 |
| 2011/0126903 A1 | 6/2011 | Kobayashi et al. |
| 2011/0156045 A1* | 6/2011 | Higashi et al. .................. 257/66 |

OTHER PUBLICATIONS

Schnitzer, I., et al. "30% External Quantum Efficiency From Surface Textured, Thin—Film Light—Emitting Diodes" Applied Physics Letters, vol. 63. Aug. 1993. pp. 2174-2176.

Takano, Y., et al. "Solid Phase Epitaxial Growth of GAAS on Si(111)" Applied Physics Letters, vol. 56, Issue 17. Feb. 1990. pp. 1664-1666.

* cited by examiner

TEXTURED MULTI-JUNCTION SOLAR CELL AND FABRICATION METHOD

RELATED APPLICATION INFORMATION

This application is a Continuation application of copending U.S. patent application Ser. No. 13/535,974 filed on Jun. 28, 2012, incorporated herein by reference in its entirety.

BACKGROUND

1. Technical Field

The present invention relates to multi junction photovoltaic devices, and more particularly to textured multi-junction photovoltaic devices and fabrication methods that result in increased efficiency.

2. Description of the Related Art

Solar devices employ photovoltaic cells to generate current flow. Photons in sunlight hit a solar cell or panel and are absorbed by semiconducting materials, such as silicon. Carriers gain energy allowing them to flow through the material to produce electricity. Therefore, the solar cell converts the solar energy into a usable amount of electricity.

A photon need only have greater energy than that of a band gap to excite an electron from the valence band into the conduction band. Since solar radiation is composed of photons with energies greater than the band gap of silicon, the higher energy photons will be absorbed by the solar cell, with some of the energy (above the band gap) being turned into heat rather than into usable electrical energy.

To enhance efficiency of solar cells, multi-junction cells have been developed. Multi-junction cells include two or more cells stacked on top of each other. Any radiation transmitted through a top cell has a chance of being absorbed by a lower cell.

Multi junction solar cells composed of a stack of semiconductor materials with different band gaps offer higher cell efficiency, but further improvements in efficiency are desirable and needed.

SUMMARY

A multi-junction photovoltaic device includes a germanium layer having pyramidal shapes with (111) facets exposed to form a textured surface. A first p-n junction is formed on or over the textured surface. Another p-n junction is formed over the first p-n junction and following the textured surface.

Another multi-junction photovoltaic device includes a germanium layer having pyramidal shapes with (111) facets exposed to form a textured surface and a plurality of p-n junctions formed from III-V semiconductor materials. The plurality of p-n junctions are foamed to follow a shape of the (111) facets of the textured surface to increase light trapping and to increase overall device efficiency. The semiconductor III-V materials have an associated bandgap energy such that the p-n junctions are ordered by decreasing bandgap energies.

Yet another multi junction photovoltaic device includes a germanium layer having pyramidal shapes with (111) facets exposed to form a textured surface. A first p-n junction is formed on or in the germanium layer by doping a top portion of the germanium layer. A second p-n junction is formed on the first p-n junction by an epitaxially grown GaAs-containing layer. A third p-n junction is formed on the second p-n junction by an epitaxially grown GaP-containing layer, wherein the p-n junctions follow a shape of the (111) facets of the textured surface to increase light trapping and to increase overall device efficiency.

A method for forming a multi-junction photovoltaic device includes providing a germanium layer; etching pyramidal shapes in the germanium layer such that (111) facets are exposed to form a textured surface; forming a first p-n junction on or over the textured surface from III-V semiconductor materials; and forming at least one other p-n junction over the first p-n junction from III-V semiconductor materials and following the textured surface.

Another method for forming a multi junction photovoltaic device includes providing a germanium layer; wet etching the germanium layer using an acidic etchant including hydrogen peroxide and one of phosphoric acid and hydrofluoric acid; forming pyramidal shapes in the germanium layer such that (111) facets are exposed to form a textured surface; doping a top surface of the germanium layer to form a first p-n junction on or over the textured surface; depositing a first semiconductor layer on the top surface which follows a profile of the textured surface; and doping a portion of the first semiconductor layer to form a second p-n junction.

Yet another method for forming a multi junction photovoltaic device includes providing one of bulk germanium or a germanium layer formed on a silicon substrate; wet etching the germanium layer using an acidic etchant including phosphoric acid, hydrogen peroxide and ethanol in a 1:1:1 ratio; forming pyramidal shapes in the germanium layer such that (111) facets are exposed to form a textured surface; doping a top surface of the germanium layer to form a first p-n junction on or over the textured surface; depositing a first semiconductor layer on the top surface which follows a profile of the textured surface, wherein the first semiconductor layer includes a GaAs layer or alloys thereof; doping a portion of the first semiconductor layer to form a second p-n junction; depositing a second semiconductor layer on the first semiconductor layer, the second semiconductor layer following the profile of the textured surface, wherein the second semiconductor layer includes a GaP layer or alloys thereof; and doping a portion of the second semiconductor layer to form a third p-n junction.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
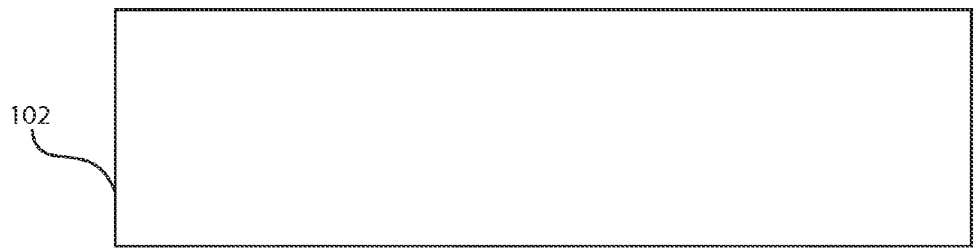
FIG. 1 is a cross-sectional view of a substrate or layer of germanium in accordance with the present principles.

In accordance with the present principles, multi-junction photovoltaic cells are formed by wet etching a surface of monocrystalline (bulk) Germanium (Ge) to enhance etching in a particular crystallographic direction. The wet etching provides a three-dimensional textured surface for forming semiconductor layers which provide junctions of the device. Ge (either as bulk or epitaxially grown on Si) is lattice matched to GaAs (Si is not lattice matched to GaAs). The use of GaAs gives rise to greater flexibility in material selection, which is useful in designing and fabricating multi junction devices. For example, cell efficiency of greater than 40% has been shown for tandem cells with InGaP/InGaAs/Ge materials. Texturing of multi-junction cells using non-Si-based materials has not been reported, especially for large area structures needed for large solar panels.

In accordance with particularly useful embodiments, anisotropic wet etching is employed to form (111) facets on a Ge substrate (bulk Ge or Ge layer grown epitaxially on Si). The multi-junction cell is then formed on the (111) facets by epitaxially growing III-V semiconductor layers. Note that the Ge needs to be thick enough to complete the (111) facets in Ge. Note that forming (111) grooves on a Si substrate and then growing Ge on a (111) Si surface is extremely slow or near impossible and not practical from a manufacturing standpoint.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer or substrate. The photolithographic masks are utilized to define areas of the wafer/substrate (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_x$, $Ga_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention will be described in terms of a particular tandem (multi-junction) structure; however, other architectures, structures, substrate materials and process features and steps may be varied within the scope of the present invention. The tandem structure includes cells, which will be described in terms of a particular material. Each cell includes a p-doped layer, an n-doped layer and perhaps an undoped intrinsic layer. For the present description, the n-doped layer and p-doped layers will be formed either from a same base material that is doped to provide an n-type portion and a p-type portion or from two different base materials so that a first material is doped to provide the n-type portion and the second material is doped to provide the p-type portion. For simplicity, each cell layer will be described in terms of the base layer material. The n-doped and p-doped regions are preferably formed by doping during epitaxial growth. Other doping methods may also be employed. While intrinsic layers may be formed between the n-type and p-type layers, e.g., very thin intrinsic layers inserted intentionally between an emitter and a base to mitigate intermixing of the dopants at a junction, the intrinsic layers, if needed, are not depicted in the drawings for simplicity.

Referring now to the drawings in which like numerals represent the same or similar elements and initially to FIG. 1, a substrate 102 is shown. The substrate 102 may include a bulk Ge wafer or a relaxed Ge layer epitaxially grown on Si (not on (111) Si surfaces), or a Ge layer bonded to a Si or silicon-on-insulator (SOI) substrate. The Ge layer of the substrate 102 needs to be thick enough, e.g., ranging from about 5 µm to about 500 µm to permit the formation of textured surfaces having a depth sufficient to form two or more tandem cells or junctions.

Figure 2:
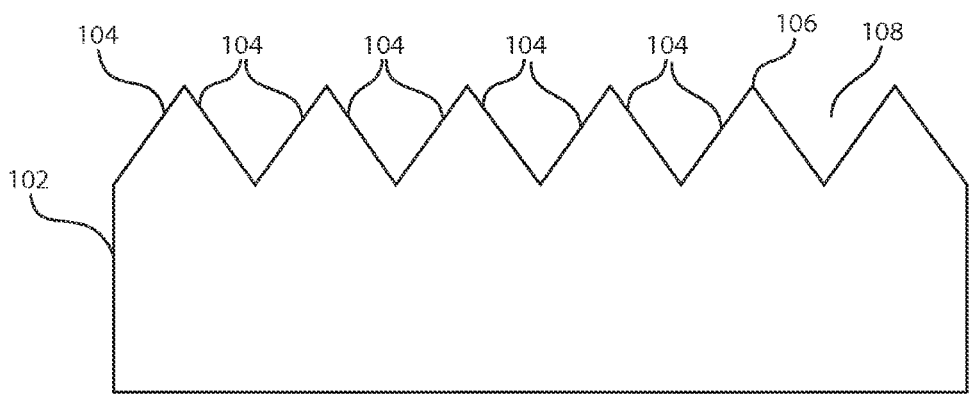
FIG. 2 is a cross-sectional view of the substrate or layer of FIG. 1 after wet etching to expose (111) surfaces to form a three-dimensional textured surface in accordance with the present principles.

Referring to FIG. 2, the Ge substrate 102 is then textured into pyramid structures 106 and/or inverse pyramid structures 108. The structures 106, 108 include (111) facets 104. FIG. 2 is shown in cross-section, however, the pyramidal structures 106 are three-dimensional having four (111) surfaces as facets 104 per structure that meet at edges of the structures 106. The inverse structures 108 extend into the substrate 102 also having four (111) surfaces as facets 104 per structure 108.

The texturing is preferably performed using an anisotropic wet etch that exposes (111) surfaces to form the facets 104. In one embodiment, the wet etching includes a diluted form of one or more of phosphoric acid ($H_3PO_4$), hydrogen peroxide ($H_2O_2$) and/or ethanol ($C_2H_5OH$). In one embodiment, $H_3PO_4:H_2O_2:C_2H_5OH$ is employed in a 1:1:1 ratio for etching the substrate 102. In another embodiment, an acidic chemistry of $HF:H_2O_2:H_2O$ in a 17:17:66 ratio may be employed for wet etching.

Figure 3:
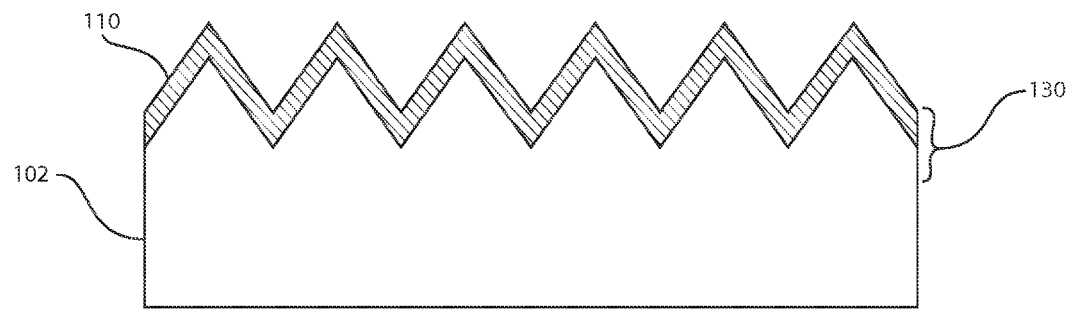
FIG. 3 is a cross-sectional view of the structure of FIG. 2 after doping a top surface of the substrate in accordance with the present principles.

Referring to FIG. 3, a first p-n junction 130 is formed. The p-n junction is formed on or in Ge substrate or layer 102. This may include an ion implantation process to implant dopants into the Ge substrate or layer 102 and annealing to form layer 110. In another embodiment, a gas phase diffusion may be employed to form layer 110. In yet another embodiment, diffusion from a solid-source (solid phase) such as phosphorosilicoglass (PSG) or borosilicoglass (BSG) or a spin-on-oxide that contains the desired doping material is employed. The layer 110 may include an n-type layer. The ion implantation, gas phase diffusion, or solid phase diffusion dope the Ge substrate or layer 102 with n-type dopants, the substrate 102 being the p-type layer for the junction 130. It should be noted that the conductivity types may be juxtaposed (n-p) with the correct material selection or doping processes being employed.

Figure 4:
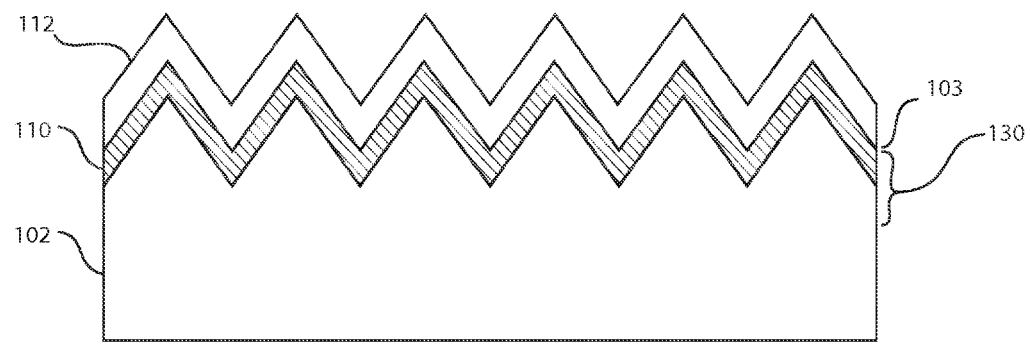
FIG. 4 is a cross-sectional view of the structure of FIG. 3 after forming a first semiconductor layer in accordance with the present principles.

Referring to FIG. 4, the p-n junction 130 may alternately be formed during the epitaxial growth of a first semiconductor layer 112. For example, if the first semiconductor layer 112 includes GaAs, the GaAs is grown on Ge 102. As diffuses into substrate 102 during the epitaxial growth also forming layer 110 and resulting in the formation of the p-n junction 130. The first semiconductor layer 112 is then continued (epitaxially grown) on the textured Ge 102 to complete formation. The semiconductor layer 112 has a bandgap that is greater than that of the Ge substrate 102.

In another embodiment where the layer 110 is formed before depositing the first semiconductor layer 112, the semiconductor layer 112 may include GaAs or InGaAs and can alternately be grown using a metal organic chemical vapor deposition (MOCVD) process. To form a shallow junction in Ge by suppressing As diffusion while growing the As-containing buffer layer, a diffusion barrier layer 103 may be grown at the interface between layers 110 and 112. The barrier layer 103 may include an InGaP layer that is also lattice-matched with Ge. The growth of III-V semiconductor layers on Ge is performed at temperatures below 700° C. A tunneling junction (not shown) is a layer heavily doped with III-V dopants, which is preferably formed between two adjacent sub-cells (e.g., between layers 110 and 112).

Figure 5:
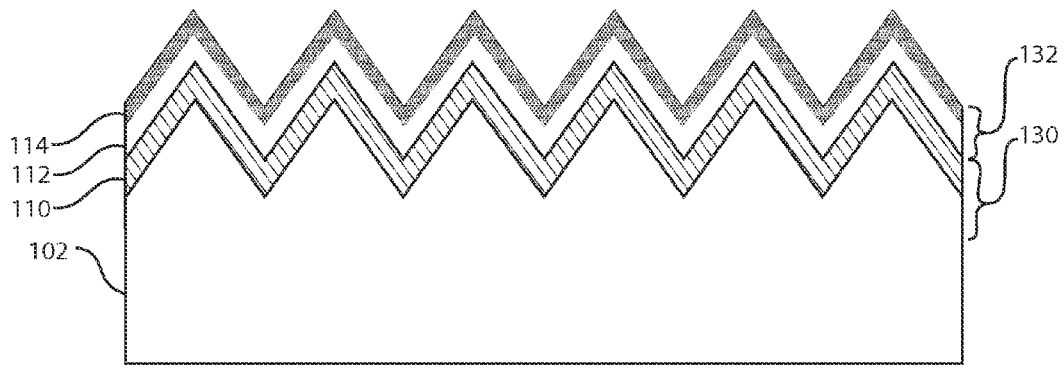
FIG. 5 is a cross-sectional view of the structure of FIG. 4 after doping a portion of the first semiconductor layer in accordance with the present principles.

Referring to FIG. 5, a p-n junction 132 is then formed in the first semiconductor layer 112 by doping a portion of layer 112. The p-n junction 132 can be formed by in-situ doping of the semiconductor layer 112 during the growth or by a later doping process as described above. The structures of FIG. 5 provide two tandem junctions having lattice matching and compatible band gap energies which improve the efficiency of the device. In addition, the multi junction structure is formed on the (111) facets 104 which provides a geometric pyramidal shape that improves light trapping and therefore device efficiency. Additional junctions may be added to the structure of FIG. 5 as needed.

Figure 6:
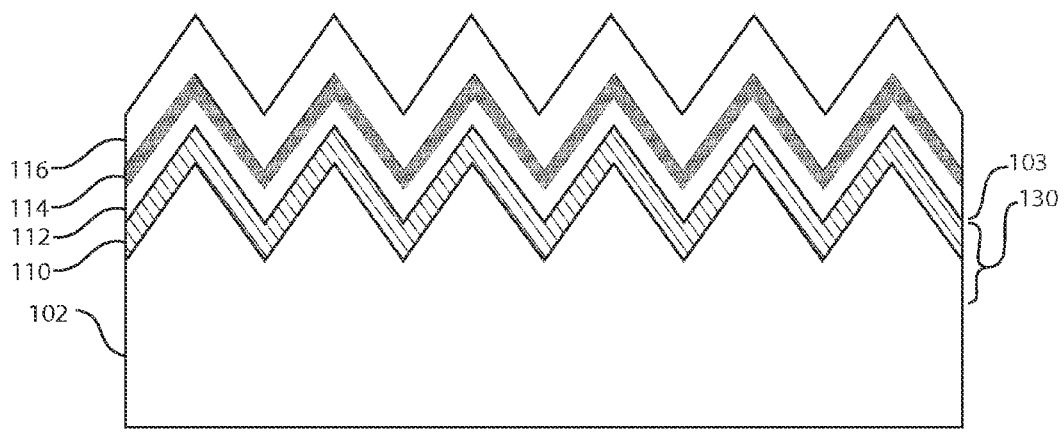
FIG. 6 is a cross-sectional view of the structure of FIG. 5 after forming a second semiconductor layer in accordance with the present principles.
Figure 7:
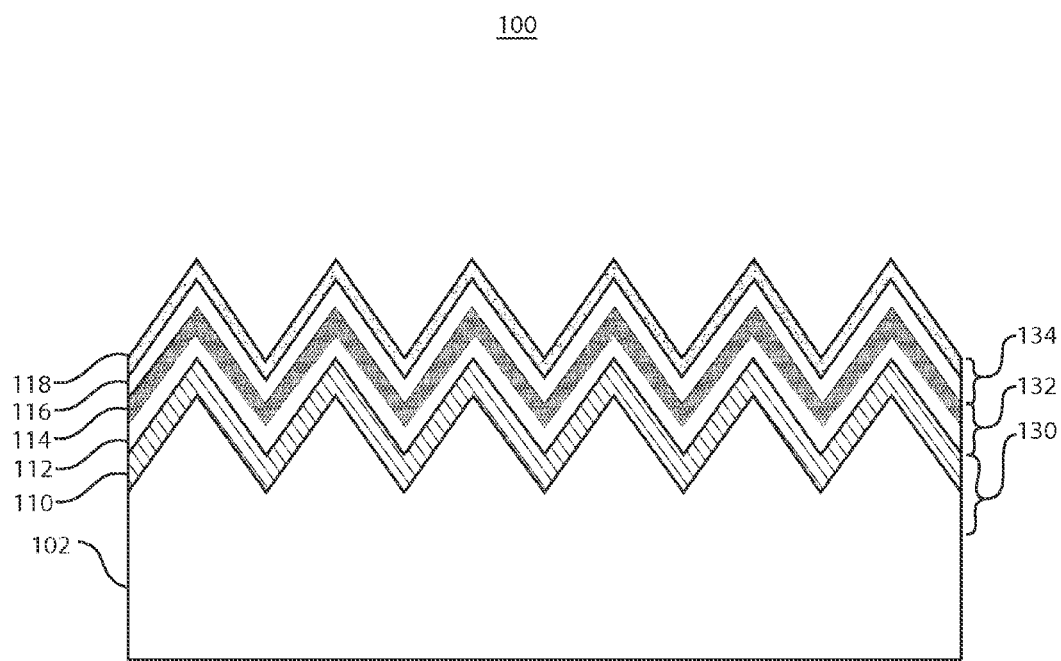
FIG. 7 is a cross-sectional view of the structure of FIG. 6 after doping a portion of the second semiconductor layer in accordance with the present principles.

Referring to FIG. 6, additional semiconductor layers can be grown on the structure of FIG. 5. An additional semiconductor layer 116 may include GaP, InGaP, InGaAlP, AlGaAs or other material lattice matched with and having a bandgap greater than that of material of the layer 112. For purposes of this disclosure, lattice matched means substantially free from strain due to lattice mismatch. This includes, e.g., a strain of about 1% or less as being a practical limit on defect-free growth. As the number of junctions increases, the diodes with larger bandgap tend to be thinner (e.g., on the order of a few hundreds of nm). Therefore, slight strain may not be detrimental to the solar cell performance as long as the defect density is, e.g., less than about $10^6$ cm$^{-2}$. A p-n junction 134 is formed by doping the additional semiconductor layer 116 to form layer 118 in a multi-junction device 100 as depicted in FIG. 7. A tunneling junction (not shown) is preferably formed between layers 114 and 116).

A p-n junction 134 (FIG. 7) can be formed by in-situ doping of the semiconductor layer 116 during the growth or by a later doping process as described. The structure of FIG. 7 provides three tandem junctions having lattice matching and compatible band gap energies which improve the efficiency of the device 100. The multi-junction structure is formed on the (111) facets 104 which provide a geometric pyramidal shape that improves light trapping and therefor device efficiency. Additional junctions may be added to the structure of FIG. 7 as needed.

Once the multi junction tandem cell 100 is completed, device fabrication is continued by metallization, deposition of anti-reflection coating layers, optional layer transfers, etc. as is known in the art.

To increase the performance of the device 100, it is desirable that any radiation that passes through a top cell or p-n junction 134 is absorbed in lower junctions or cells (or sub-cells) 132, 130. This is achieved by providing energy gap splitting ($E_g$ splitting). For example, the top cell 134 has higher band gap materials and receives light first. The light spectra that are not absorbed at the top cell 134 enter the cell 132. A larger band gap difference between two different junctions is better to prevent the light spectra from being shared between the junctions. This is to maximize photocurrent. Energy gap splitting permits the absorption of radiation with different energies between the cells. Since the band gap of the top cell 134 is maintained at a higher level, the lower level cell(s) 132, 130 is/are designed to have a lower band gap. In this way, the lower cells have a higher probability of absorbing transmitted radiation, and the entire multi-junction cell becomes more efficient since there are fewer photon energy levels shared between the layered cells. This results in an increased probability of absorbing light passing through to the bottom cell 130 hence increasing the current in the lower cells 132, 130 and increasing short circuit current, $J_{SC}$.

To increase efficiency, it is preferable that a greater difference between band gaps exists between the top cell 134 (higher band gap), and the bottom cell 130 (lower band gap) by keeping an absolute high level of band gap energy ($E_g$) for all cells to maintain high open circuit voltage, Voc.

Figure 8:
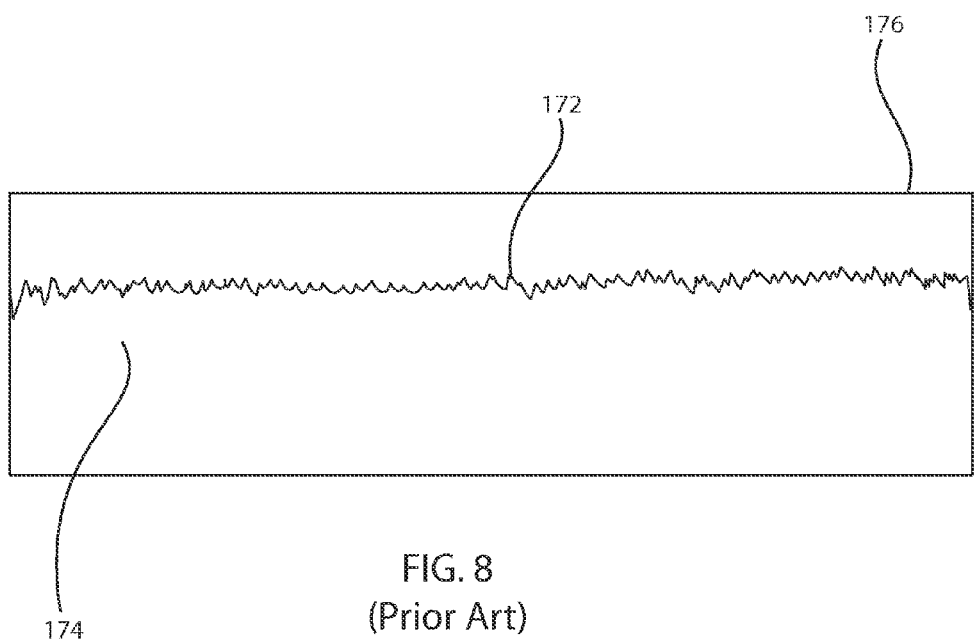
FIG. 8 is a cross-section view showing a roughed surface in accordance with the prior art.

Referring to FIG. 8, a conventional textured surface device 170 shows a roughed erratic surface 172. Normally, a roughened textured surface may not be desirable, since if the surface is rough or erratically/asymmetrically formed, the rough surface can result in light scatter and optical loss due to light absorption at the rough surface.

Since the multi junction device 100, in accordance with the present principles, is formed on flat crystal surfaces, the light scatter is reduced. The shape of substrate 102 provides junctions 130, 132 and 134, formed flat over the (111) surfaces, which creates an overall textured surface configured to trap and absorb light to increase efficiency. Optical loss is not increased due to the present surfaces. Light is trapped and absorbed where it is more useful in the active layers than at intervening erratically shaped or rough surfaces.

Figure 9:
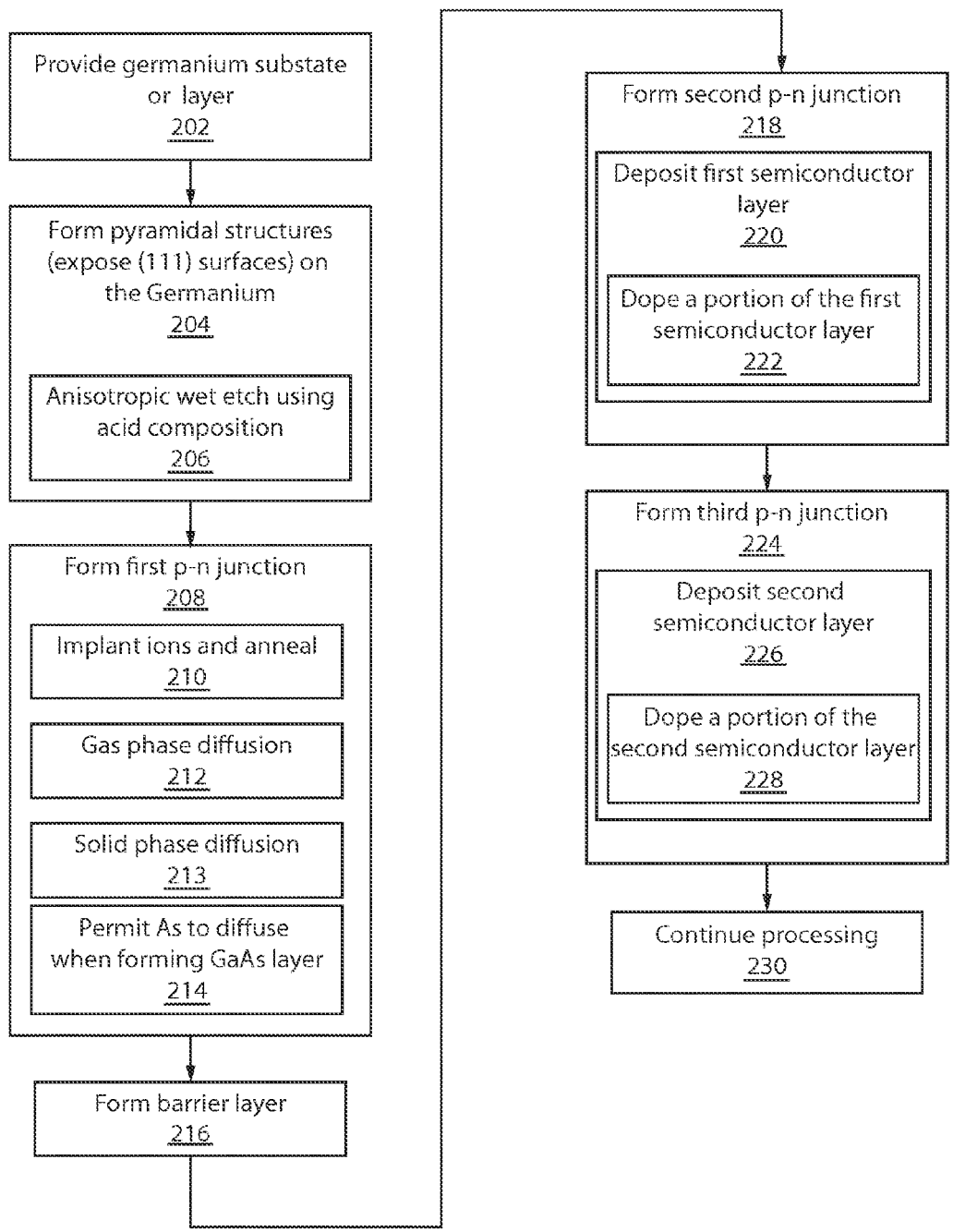
FIG. 9 is a block/flow diagram showing illustrative methods for forming a multi junction photovoltaic cell in accordance with the present principles.

Referring to FIG. 9, a method for forming a multi-junction photovoltaic device is shown in accordance with illustrative embodiments. In block 202, a germanium layer is provided. This may include providing a bulk germanium or a germanium layer formed on a silicon substrate. In block 204, pyramidal shapes are etched in the germanium layer such that (111) facets are exposed to form a textured surface. The pyramidal shapes may also include inverse pyramidal shapes.

In block 206, the etching preferably includes a wet anisotropic etch that exposes (111) surfaces in the Ge by selectively etching the Ge along other surfaces more rapidly. The etching may be performed using a 1:1:1 $H_3PO_4:H_2O_2:C_2H_5OH$ solution. In another embodiment, an acidic chemistry of $HF:H_2O_2:H_2O$ in a 17:17:66 ratio may be employed for the wet etching.

In block 208, a first p-n junction is formed on or over the textured surface from III-V semiconductor materials. In block 210, the first p-n junction is formed by implanting ions in the germanium layer. This may be followed by an activating anneal process. In block 212, the first p-n junction is formed by gas phase diffusing dopants in the germanium layer. In block, 213, the first p-n junction is formed by doping the germanium layer by diffusing from a solid source (solid phase diffusion). In block 214, the first p-n junction may include an epitaxially grown GaAs layer (or its alloys) on the germanium layer where As atoms diffuse into the germanium layer. This GaAs layer is preferably the first semiconductor layer as will be described below. In block 216, a barrier layer may be deposited between layers (e.g., Ge and GaAs), which is employed to reduce diffusion of Ge into the GaAs and vice versa. Tunnel junction doping may be performed between p-n junctions.

In block 218, at least one other p-n junction is formed over the first p-n junction from III-V semiconductor materials and follows the textured surface. In block 220, the other p-n junction is formed by depositing a first semiconductor layer over the first p-n junction. In block 222, a portion of the thickness of the first semiconductor layer is doped. This may be performed in-situ during the formation of the first semiconductor layer to form the second p-n junction. The in-situ doping is particularly beneficial when the first semiconductor layer is formed using epitaxial growth. The first semiconductor layer may be deposited using other techniques (e.g., a MOCVD process). In one alternative, the first semiconductor layer may be deposited and subsequently doped. The first semiconductor layer may include a GaAs layer or it is alloys (e.g., InGaAs, etc.).

In block 224, a third p-n junction is formed over the second p-n junction and follows the textured surface. In block 226, a second semiconductor layer is deposited over the first semiconductor layer. In block 228, a portion of the second semiconductor layer is doped. The doping may be performed in-situ, which is particularly beneficial when the second semiconductor layer is formed using epitaxial growth. The second semiconductor layer may be deposited using other techniques (e.g., a MOCVD process). In one alternative, the second semiconductor layer may be deposited and subsequently doped. The second semiconductor layer may include a GaP layer or it is alloys (e.g., GaInP, etc.).

In block 230, processing may continue with the formation of additional p-n junctions. Further processing also includes the formation of contacts and other structures needed for completing the device. It should be understood that layers such as emitter layers, tunnel junction layers, contact layers, buffer layers, reflective layers, etc. may be formed as is known in the art.

Having described preferred embodiments for a textured multi-junction solar cell and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a multi-junction photovoltaic device, comprising:
    providing a germanium layer;
    wet etching pyramidal shapes in the germanium layer such that (111) facets are exposed to form a textured surface, wherein the wet etching is performed using an acidic etchant including phosphoric acid, hydrogen peroxide and ethanol in a 1:1:1 ratio;
    forming a first p-n junction directly on the textured surface from III-V semiconductor materials, which follow the textured surface; and
    forming at least one other p-n junction directly on the first p-n junction from III-V semiconductor materials and following the textured surface.

2. The method as recited in claim 1, wherein providing the germanium layer includes providing one of bulk germanium or a germanium layer formed on a silicon substrate.

3. The method as recited in claim 1, wherein the pyramidal shapes include inverse pyramidal shapes.

4. The method as recited in claim 1, wherein forming the first p-n junction includes implanting ions in the germanium layer.

5. The method as recited in claim 1, wherein forming the first p-n junction includes one of gas phase or solid phase diffusion of dopants in the germanium layer.

6. The method as recited in claim 1, wherein forming the first p-n junction includes epitaxially growing a GaAs layer on the germanium layer.

7. The method as recited in claim 1, wherein forming at least one other p-n junction over the first p-n junction includes depositing a first semiconductor layer over the first p-n junction; and in-situ doping a portion of the first semiconductor layer.

8. The method as recited in claim 7, wherein the first semiconductor layer includes a GaAs-containing layer.

9. The method as recited in claim 1, further comprising forming a third p-n junction over the at least one other p-n junction and following the textured surface.

10. The method as recited in claim 1, wherein the third p-n junction includes a GaP-containing layer.

11. A method for forming a multi junction photovoltaic device, comprising:
  providing a germanium layer;
  wet etching the germanium layer using an acidic etchant including phosphoric acid, hydrogen peroxide and ethanol in a 1:1:1 ratio;
  forming pyramidal shapes in the germanium layer such that (111) facets are exposed to form a textured surface;
  doping a top surface of the germanium layer to form a first p-n junction on or over the textured surface;
  depositing a first semiconductor layer on the top surface which follows a profile of the textured surface; and
  doping a portion of the first semiconductor layer to form a second p-n junction, wherein the second p-n junction is formed directly on the first p-n junction.

12. The method as recited in claim 11, wherein providing the germanium layer includes providing one of bulk germanium or a germanium layer formed on a silicon substrate.

13. The method as recited in claim 11, wherein the pyramidal shapes include inverse pyramidal shapes.

14. The method as recited in claim 11, wherein doping the top surface includes implanting ions and annealing the germanium layer.

15. The method as recited in claim 11, wherein doping the top surface includes one of gas phase or solid phase diffusion of dopants in the germanium layer.

16. The method as recited in claim 11, wherein depositing a first semiconductor layer includes epitaxially growing a GaAs-containing layer on the germanium layer wherein the step of doping the top layer includes diffusing As into the top surface to form the first p-n-junction.

17. The method as recited in claim 11, further comprising depositing a second semiconductor layer on the first semiconductor layer, the second semiconductor layer following the profile of the textured surface; and
doping a portion of the second semiconductor layer to form a third p-n junction.

18. The method as recited in claim 17, wherein the second semiconductor layer includes GaP or alloys thereof.

19. The method as recited in claim 11, wherein the first semiconductor layer includes GaAs or alloys thereof.

20. A method for forming a multi-junction photovoltaic device, comprising:
  providing one of bulk germanium or a germanium layer formed on a silicon substrate;
  wet etching the germanium layer using an acidic etchant including phosphoric acid, hydrogen peroxide and ethanol in a 1:1:1 ratio;
  forming pyramidal shapes in the germanium layer such that (111) facets are exposed to form a textured surface;
  doping a top surface of the germanium layer to form a first p-n junction on or over the textured surface;
  depositing a first semiconductor layer on the top surface which follows a profile of the textured surface, wherein the first semiconductor layer includes a GaAs layer or alloys thereof;
  doping a portion of the first semiconductor layer to form a second p-n junction;
  depositing a second semiconductor layer on the first semiconductor layer, the second semiconductor layer following the profile of the textured surface, wherein the second semiconductor layer includes a GaP layer or alloys thereof; and
  doping a portion of the second semiconductor layer to form a third p-n junction.

21. The method as recited in claim 20, wherein the pyramidal shapes include inverse pyramidal shapes.

22. The method as recited in claim 20, wherein doping the top surface includes implanting ions and annealing the germanium layer.

23. The method as recited in claim 20, wherein doping the top surface includes one of gas phase and solid phase diffusion of dopants in the germanium layer.

24. The method as recited in claim 20, wherein depositing a first semiconductor layer includes epitaxially growing a GaAs-containing layer on the germanium layer wherein the step of doping the top layer includes diffusing As into the top surface to form the first p-n-junction.

* * * * *